(12) United States Patent
Pan et al.

(10) Patent No.: US 7,694,498 B2
(45) Date of Patent: Apr. 13, 2010

(54) GAS FILLING APPARATUS AND GAS FILLING PORT THEREOF

(75) Inventors: Yung-Shun Pan, Shulin (TW); Yu-Ming Chen, Shulin (TW)

(73) Assignee: Gudeng Precision Industrial Co., Ltd, Taipei County (TW)

( * ) Notice: Subject to any disclaimer, the term of this patent is extended or adjusted under 35 U.S.C. 154(b) by 58 days.

(21) Appl. No.: 12/255,313

(22) Filed: Oct. 21, 2008

(65) Prior Publication Data

US 2009/0260331 A1 Oct. 22, 2009

(30) Foreign Application Priority Data

Apr. 17, 2008 (TW) .............................. 97113890 A

(51) Int. Cl.
*B65B 31/04* (2006.01)
(52) U.S. Cl. .................. 53/510; 53/432; 53/111 R; 53/133.1
(58) Field of Classification Search ............. 53/403, 53/405, 408, 428, 432, 111 R, 510, 133.1
See application file for complete search history.

(56) References Cited

U.S. PATENT DOCUMENTS

| | | | | |
|---|---|---|---|---|
| 5,747,718 | A * | 5/1998 | Bill et al. ..................... | 86/23 |
| 5,911,249 | A * | 6/1999 | Sanfilippo et al. ............ | 141/64 |
| 6,389,672 | B1 * | 5/2002 | Ishii et al. ..................... | 29/430 |
| 6,571,530 | B1 * | 6/2003 | Hikita et al. .................... | 53/53 |
| 6,897,945 | B1 * | 5/2005 | Ottens et al. .................. | 355/72 |
| 7,066,194 | B2 * | 6/2006 | Ku et al. ..................... | 137/240 |
| 7,140,393 | B2 * | 11/2006 | Sheydayi .................... | 137/875 |
| 7,412,811 | B2 * | 8/2008 | Marcus et al. ................ | 53/432 |
| 7,581,372 | B2 * | 9/2009 | Durben et al. ................ | 53/471 |

* cited by examiner

*Primary Examiner*—Christopher Harmon
(74) *Attorney, Agent, or Firm*—Ming Chow Sinorica, LLC

(57) ABSTRACT

The present invention provides a gas filling apparatus and gas filling port thereof. The gas filling apparatus is connected with the air feed apparatus which is introduced the gas into the first inlet port of the semiconductor device or reticle storage apparatus. The gas filling apparatus includes a supporting base which is provided to hold the storage apparatus thereon, and at least one second inlet port which is disposed on the first inlet port of the storage apparatus so as to the gas is flowed into the storage apparatus through the second inlet port. The second inlet port includes a first base, a second base, a first elastic element, a fixing element, and a switch device. Both of the first base and second base have through holes, and opposite to each other. The first elastic element is used to maintain the airtight and is disposed on the second base and opposite to the first inlet port of the storage apparatus used to maintain the airtight. The fixing element is used to fix the elastic element on the second base. The switch device is disposed on the gap in the middle of the first base and the second base, and is provided to control the input or output for the gas of the second inlet port.

16 Claims, 15 Drawing Sheets

GAS FILLING APPARATUS AND GAS FILLING PORT THEREOF

BACKGROUND OF THE INVENTION

1. Field of the Invention

The present invention relates to a gas filling apparatus and the inlet port therein, and more particularly to a gas filling apparatus for introducing the gas into a storage apparatus that is used to hold the semiconductor device or reticle thereon.

2. Description of the Prior Art

Recent years see rapid development of semiconductor technology, including photolithography that plays an important role therein, as photolithography is indispensable to patterning. When it comes to semiconductor, photolithography involves fabricating a transparent reticle with a specific shape in accordance with an intended circuit, and projecting a light source through the reticle to form a specific pattern on a silicon wafer by exposure and development. Any dust and particles (such as microparticles, powder, and organic matter) attached to the reticle can deteriorate the quality of imaging, and thus the reticle can be kept cleaning when used in patterning. In general, a wafer process is performed in a clean room to prevent contamination by airborne particles. However, clean rooms nowadays are not absolutely free of dust.

Hence, contamination-free reticle-holding devices, commonly known as reticle pods, for preserving and delivering reticles are used in a semiconductor process nowadays in order to keep the reticles clean during the semiconductor process. During a semiconductor process, a reticle-holding device (hereinafter referred to as a reticle pod) holds a reticle, allows the reticle to be moved and delivered between machines, insulates the reticle from ambient air, and prevents the reticle from contamination and being changed thereby. Hence, advanced semiconductor foundries usually endeavor to assure the cleanliness of standard mechanical interface (SMIF) reticle pods, that is, the reticle pods should have a Class 1 or sub-Class 1 rating for cleanliness. Hence, a gas-fillable reticle pod is one of the solutions in use.

To fill a gas into a reticle pod, the reticle pod must have at least one gas inlet port for connection with a gas-supplying device which supplies the gas to the reticle pod. The present invention provides a reticle pod and a method for keeping a reticle clean and dry, to improve the prior art regarding the position of a gas inlet port of the reticle pod, and regarding a method for introducing a gas into the reticle pod to remove moisture therefrom and carrying contaminated gas away from the reticle pod.

SUMMARY OF THE INVENTION

The present invention provides a gas filling apparatus with an inlet port therein. The gas filling apparatus is connected with the gas supply device which is used for introducing the gas into the storage apparatus with an inlet port. The gas filling apparatus includes a supporting base which is used to hold the storage apparatus and at least one inlet port which is disposed on the supporting base, the gas is filled into the storage apparatus via the inlet port.

The inlet port includes a first base, a second base, a first elastic element, a fixing element, and a switch device. Both the first base and the second base have a through hole therein, and two through holes are opposite to each other. The first elastic element used to keep the airtight, and is disposed on the second base that corresponding to the contact portion for the inlet port of the storage apparatus. The fixing element used to fix the elastic element on the second base. The switch device is disposed in the through holes of the first base and the second base, and used to control the gas that is flowed into the second inlet port.

The main feature of the invention is that the switch device which includes a hollow tube and the retractable element. The switch device controlled the input or output of the gas according to placement or the draw out of the storage apparatus. One end of the hollow tube is connected with the second base fixedly, and another end of the hollow tube has an enlarged portion which is engaged with the first base, so that the through hole of the first base is to be closed. At least one gap is disposed on the portion of the hollow adjacent to the enlarged portion, which is used to introduce the gas into the hollow tube. In addition, the retractable element is disposed around the outside of the tube, and is engaged in the middle of the first base and the second base. When the storage apparatus is disposed on the base, the first inlet port of the storage apparatus is contacted to the second inlet port, so as to the second base is moved downward due to the weight of the storage apparatus to drive the switch device downward to separate the enlarged portion of the hollow tube from the first base to expose the gap of the tube. Thus, the gas is flowed into the switch device and is filled into the storage apparatus. On the other hand, when the storage apparatus is separated from the base, the second base would be raised up by the retractable element, thereby, the enlarged portion of hollow tube would be restored the position of the through hole of the first base that being closed.

Thus, the objective of the present invention is to provide a second inlet port with a switch device, which can control the input or output of the gas according to the placement or the draw out of the storage apparatus. Thus, the artificial control or additional sensing device would not added, thus, the automation control and the economize use of the cost can be obtained.

Another objective of the present invention is to provide a second inlet port with a switch device. The second inlet port can control the input or output for the gas according to the placement or draw out of the storage apparatus, so as to the leakage of the gas can be controlled to diminish the cost.

DESCRIPTION OF THE PREFERRED EMBODIMENT

The present invention provides a gas filing apparatus with an inlet port. Following illustrations describe detailed about the reticle, semiconductor device, storage apparatus, or gas filling apparatus process is accomplished by the present technologies. Besides, the present invention may be applied to other embodiments, not limited to ones mentioned.

Figure 1:
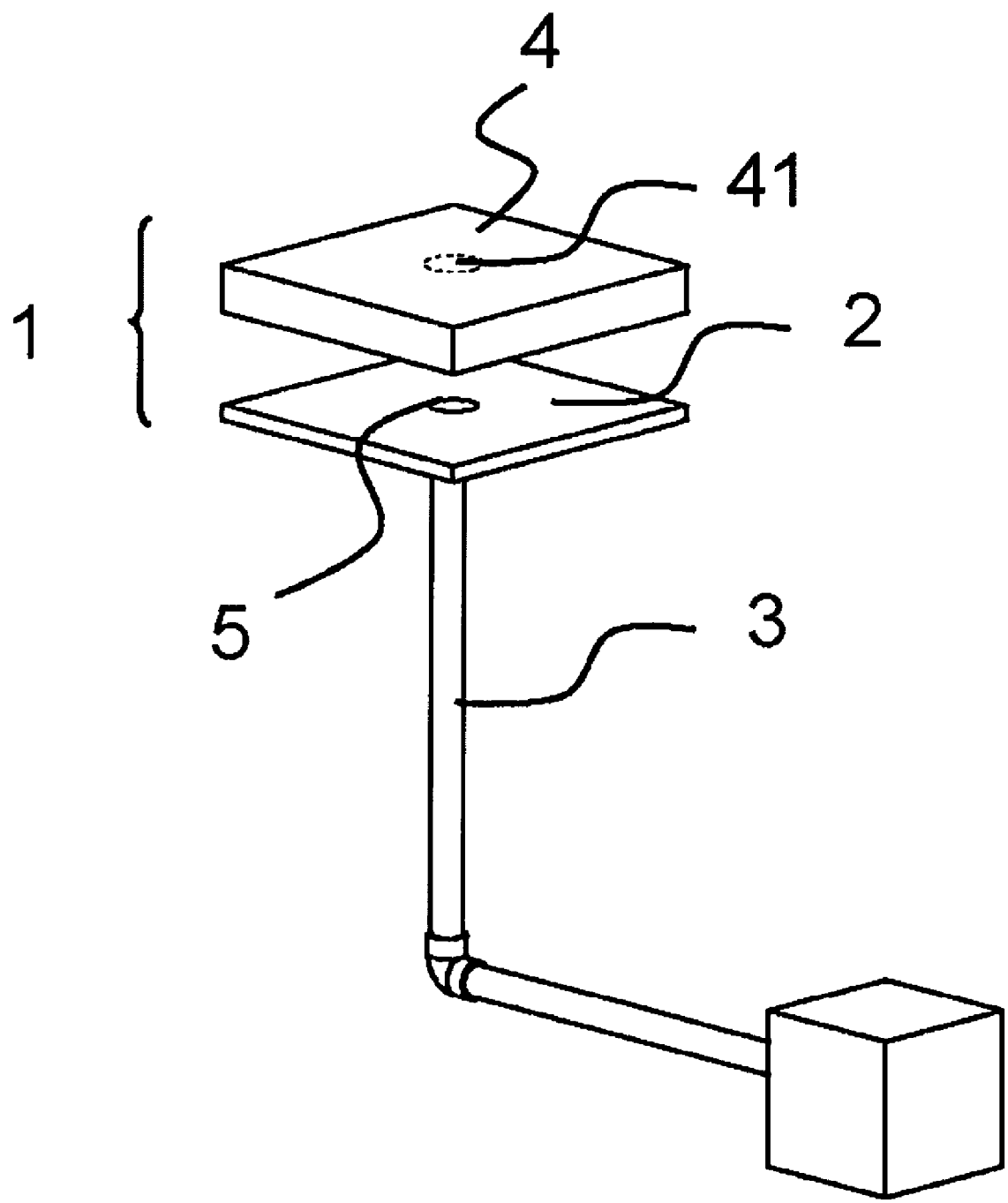
FIG. 1 shows a view of the gas filling apparatus according to present invention.

Referring to FIG. 1 shows a gas filling apparatus of the present invention. The gas filling apparatus is connected to the supply device 3, which is used for introducing the gas into a storage apparatus 4, in which the storage apparatus 4 used for holding the semiconductor device or reticle, which is not limited in this embodiment. In addition, the storage apparatus 4 includes at least a first inlet port 41. The gas filling apparatus 1 includes at least a supporting device 2 which is used for holding the storage apparatus 4. At least one second inlet port 5 is disposed on the supporting base 4 corresponding to the first inlet port 41 of the storage apparatus 4, thus, the gas is filled through the first inlet port 41 via the second inlet port into the storage apparatus 4.

Figure 2A:
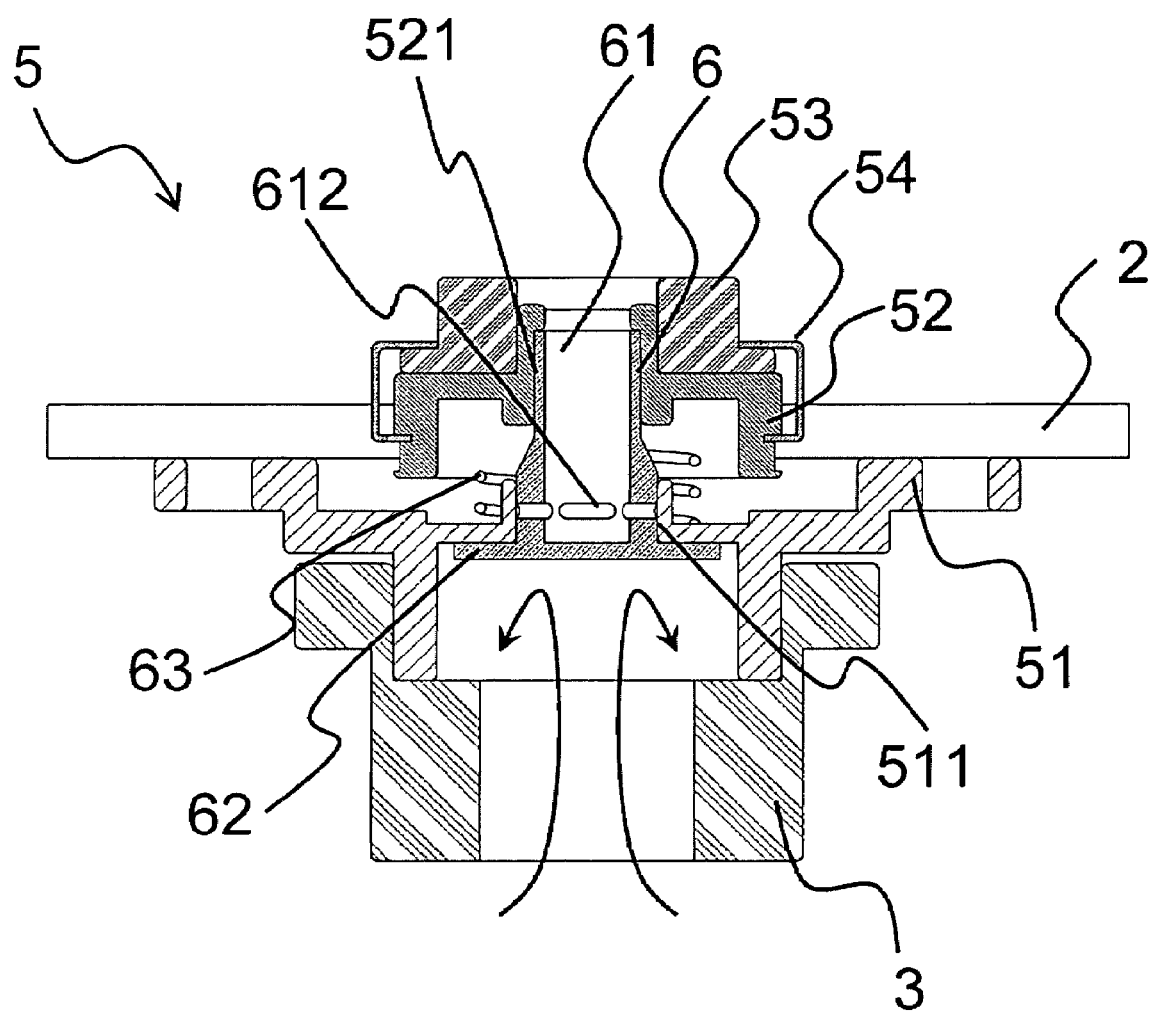
FIGS. 2A and 2B show a view of an inlet port according to present invention.
Figure 2B:
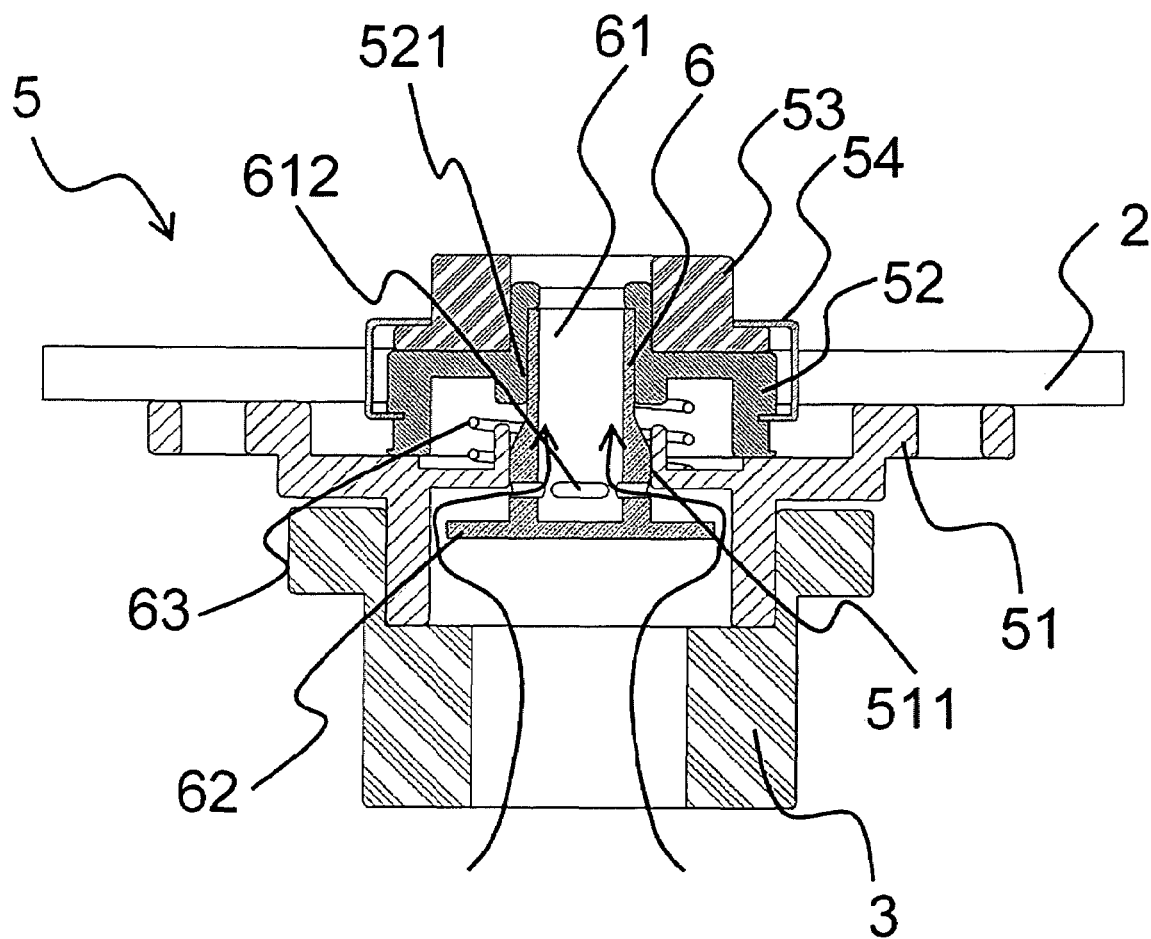

Then, referring to FIG. 2A, the second inlet port 5 includes a first base 51, a second base 53, a fixing element 54, and a switch device 6. In this embodiment, the first base 51 includes a first through hole 511, and the second base 52 is disposed on the first base 51, and a second through hole 521 is therein, in which the second through hole 521 corresponding to the first through hole 521 of the first base 51. In addition, a first elastic element 53 is disposed on the second base 52 and contacted with the first inlet port 41 of the storage apparatus 4 to maintain the airtight. The fixing element 54 is fixed on the second base 52 and is provided to fix the first elastic element 53 on the second base 52. The switch device 6 is disposed in the first through hole 511 of the first base 51 and the second through hole 521 of the second base 52 and is provided for introducing the gas that is flowed into the second inlet port 5. The switch device 6 includes a hollow tube 61 and a retractable element 63. One end of the hollow tube 61 is fixed on the second base 52, and another end of the hollow tube 61 includes an enlarged portion 62 which is engaged on the first base 51 so as to the first through hole 511 of the first base is to be closed. The portion adjacent to the enlarged portion 62 of the hollow tube 61 includes at least a gap 612, which is provided for gas flowed into the hollow tube 61. The retractable element 63 is disposed around the outside of the hollow tube 61, and engaged in the middle of the second base 52 and the first base 51. Thus, when the storage apparatus 4 is disposed on the supporting base 2, the first inlet port 41 of the storage apparatus 4 is contacted the second inlet port 5, so that the second base 52 would be moved downward due to the weight of the storage apparatus 4 to drive the switch device 6 is moved downward. Thus, the enlarged portion 62 of the switch device 6 is separated from the first base 51 to expose the gap 612 of the hollow tube 61, therefore, the gas can be flowed into the storage apparatus 4 from the gap 612 through the hollow tube 612 as shown in FIG. 2B. When the second inlet port 5 is turned on, the gas can be flowed into the second inlet port 5; else, when the storage apparatus 4 is separated from the supporting device 2, the retractable element 63 would be raised up the second base 52 to drive the enlarged portion 62 of the hollow tube to restore the position of the first through hole 511 of the first base 51 which is to be closed.

Figure 3A:
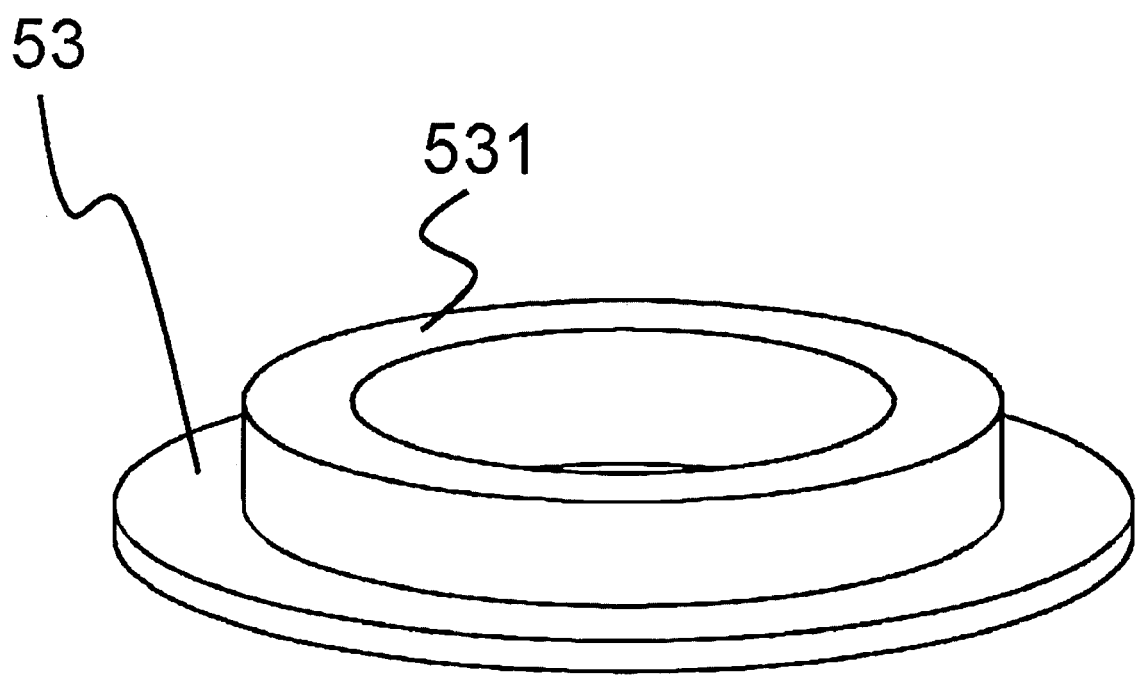
FIG. 3A and FIG. 3B show the view of a first elastic element according to present invention.
Figure 3B:
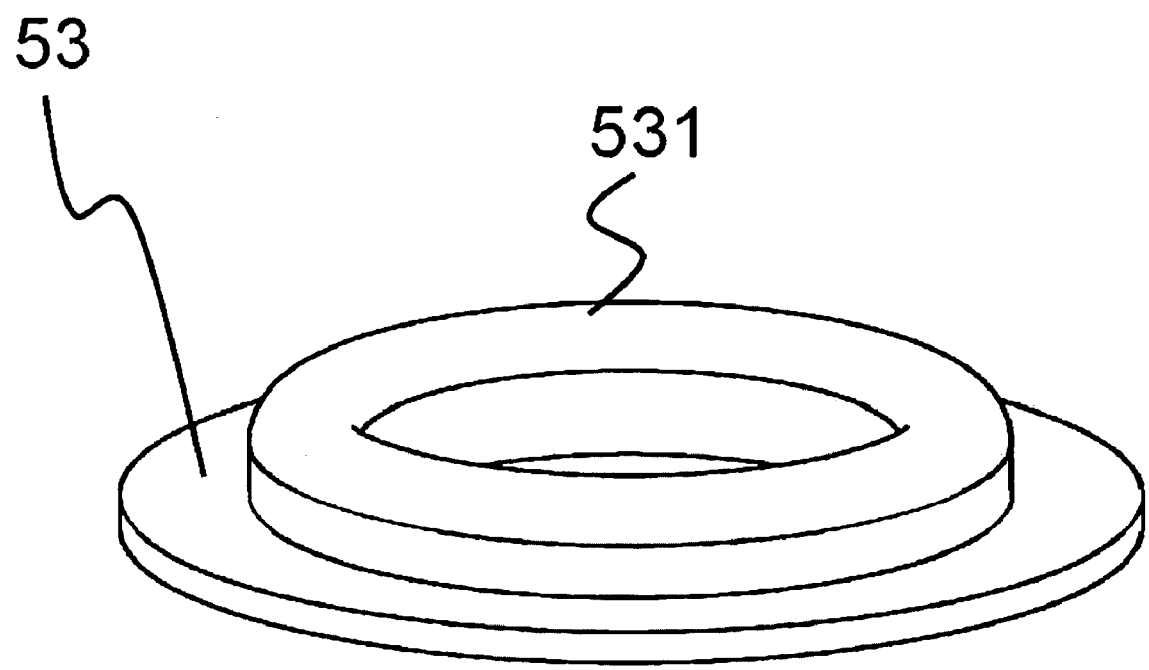

Please refer to FIG. 3A and FIG. 3B, the contact portion 531 between the first elastic element 53 of the second inlet port 5 and the first inlet 41 of the storage apparatus 4 can be a plane surface (as shown in FIG. 3A) or a cambered surface (as shown in FIG. 3B).

Figure 4A:
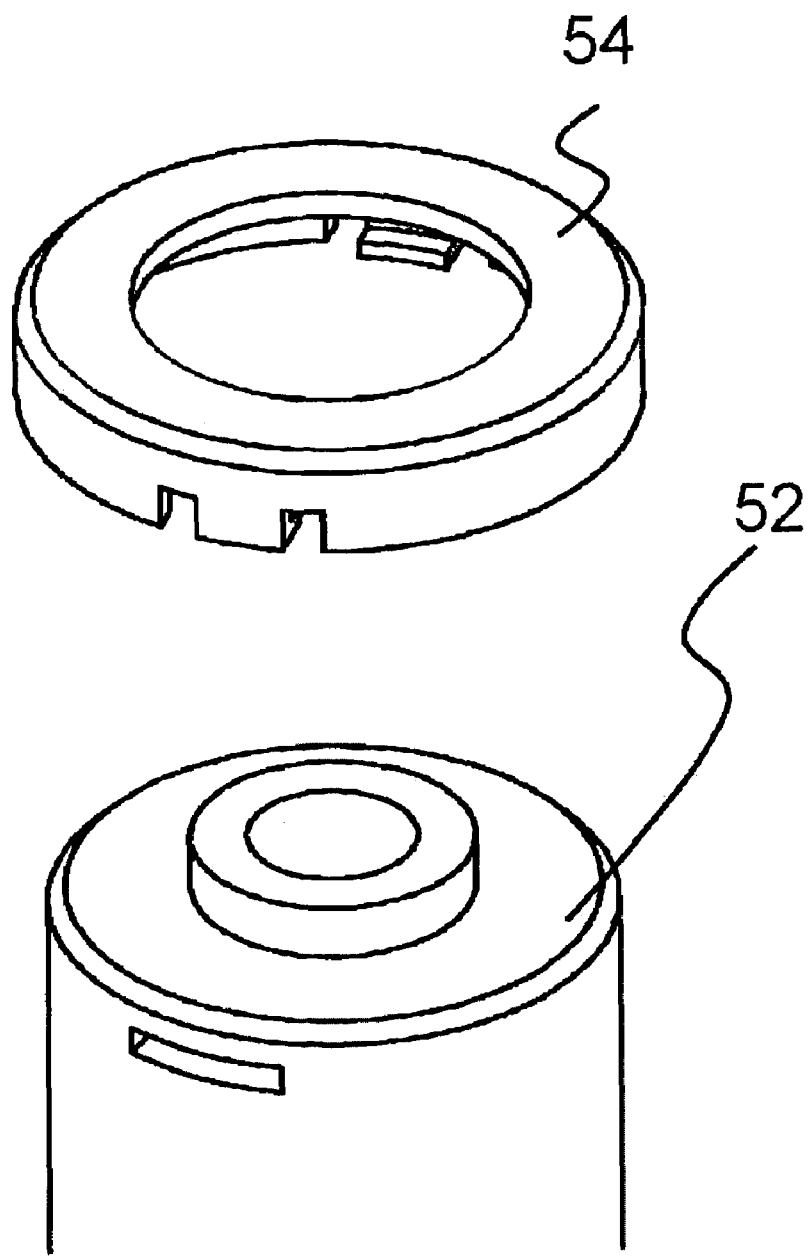
FIG. 4A and FIG. 4B show the view of the connecting between the fixing element and the second base according to present invention.
Figure 4B:
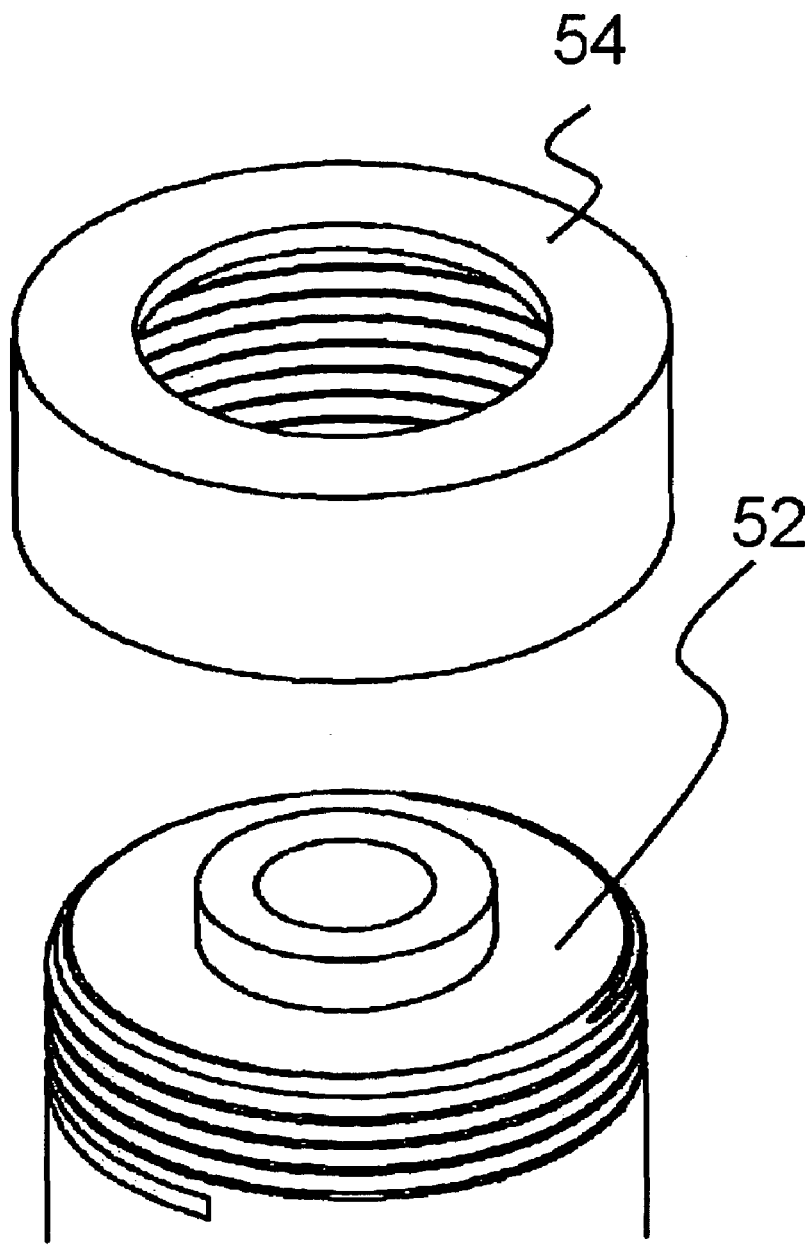

Next, referring to FIG. 4A and FIG. 4B, the fixing element 53 is fixed the second base 52 by the way of the wedge (as shown in FIG. 4A) or spiral (as shown in FIG. 4B).

Figure 5A:
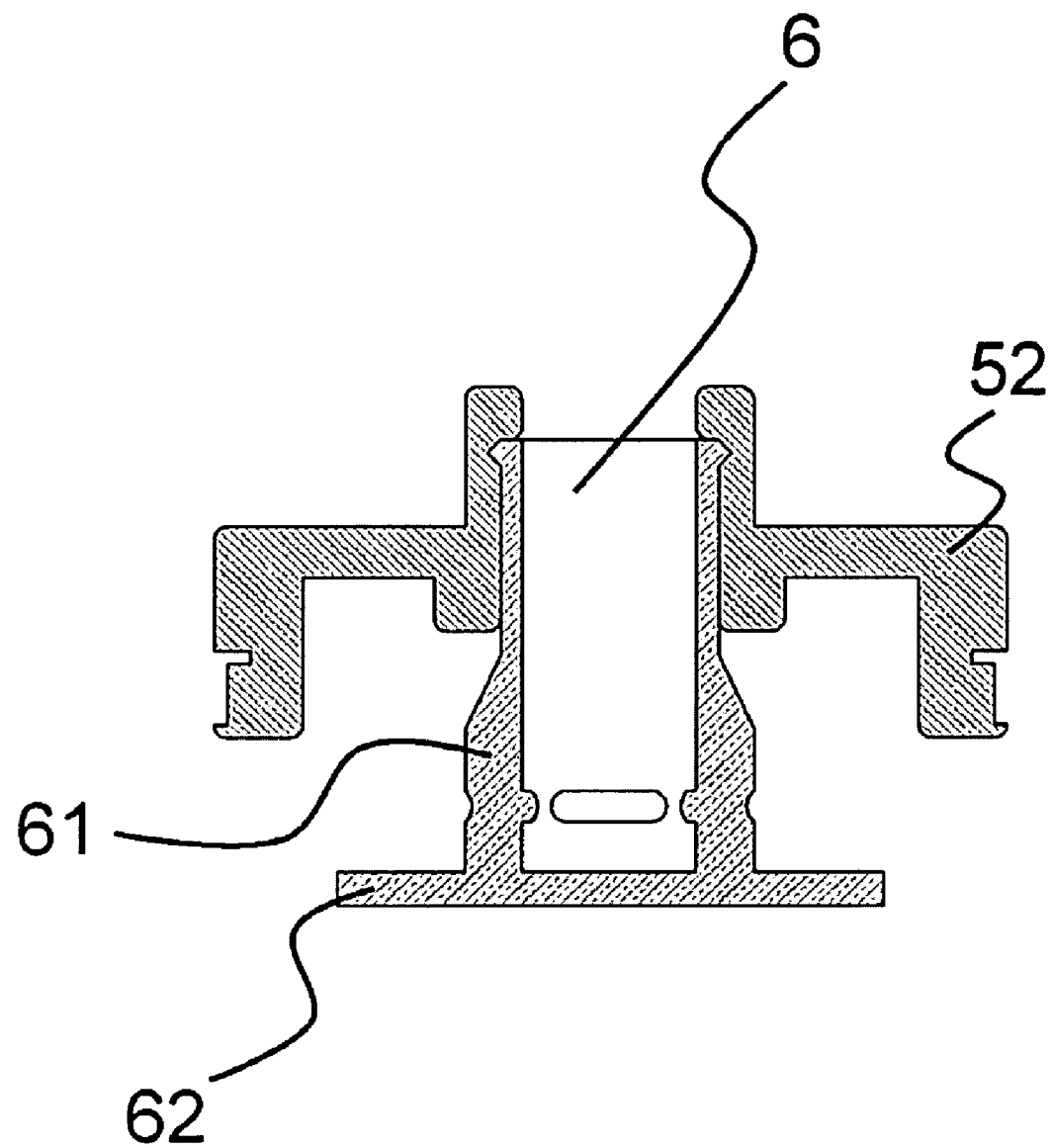
FIG. 5A and FIG. 5B show the view of the connecting between the hollow tube of the switch and the second base according to present invention.
Figure 5B:
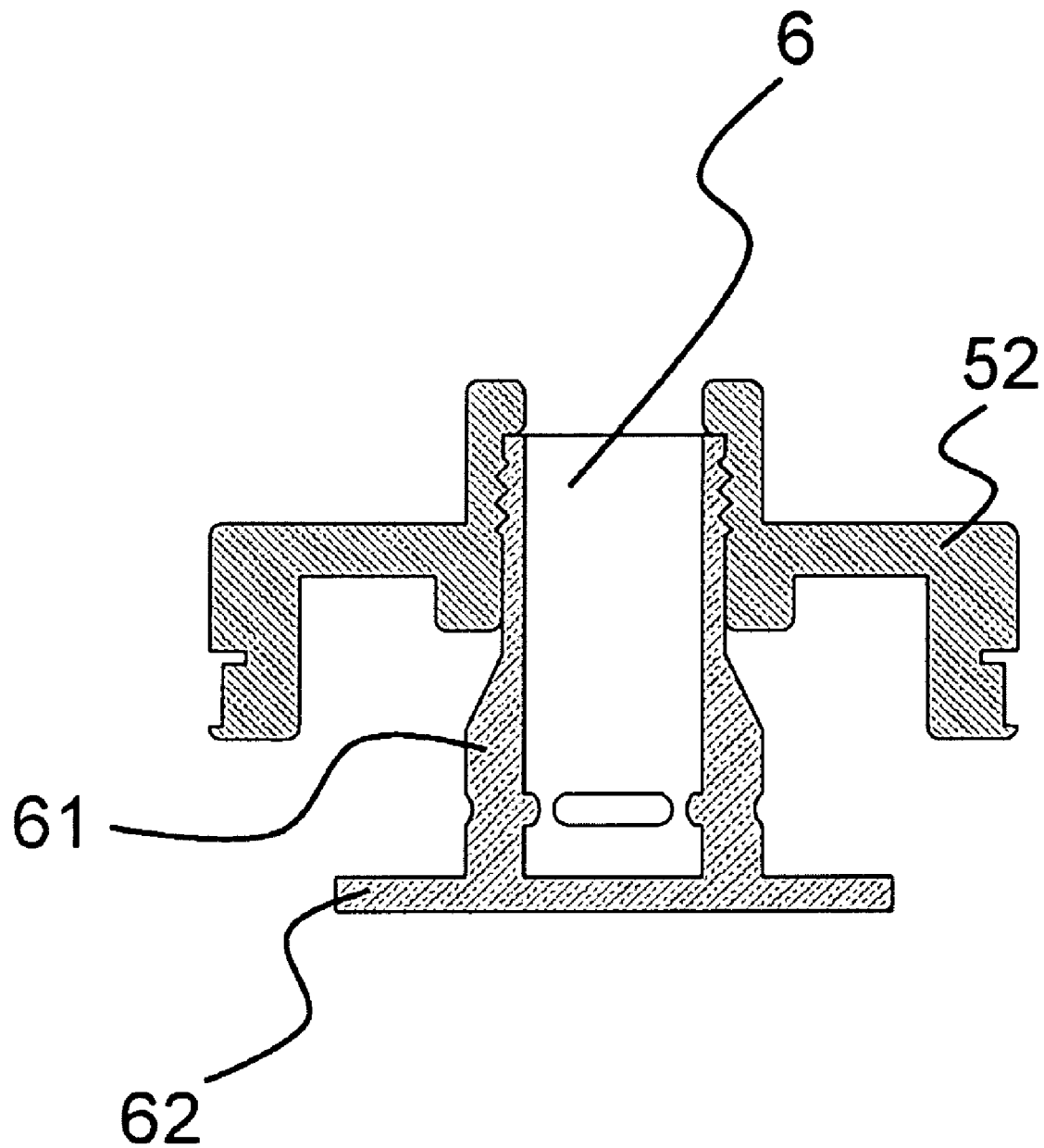

Thereafter, referring to FIG. 5A and FIG. 5B, the hollow tube 61 of the switch device 6 is fixed the second base 52 by way of the wedge (as shown in FIG. 5A) or spiral (as shown in FIG. 5B).

Figure 6:
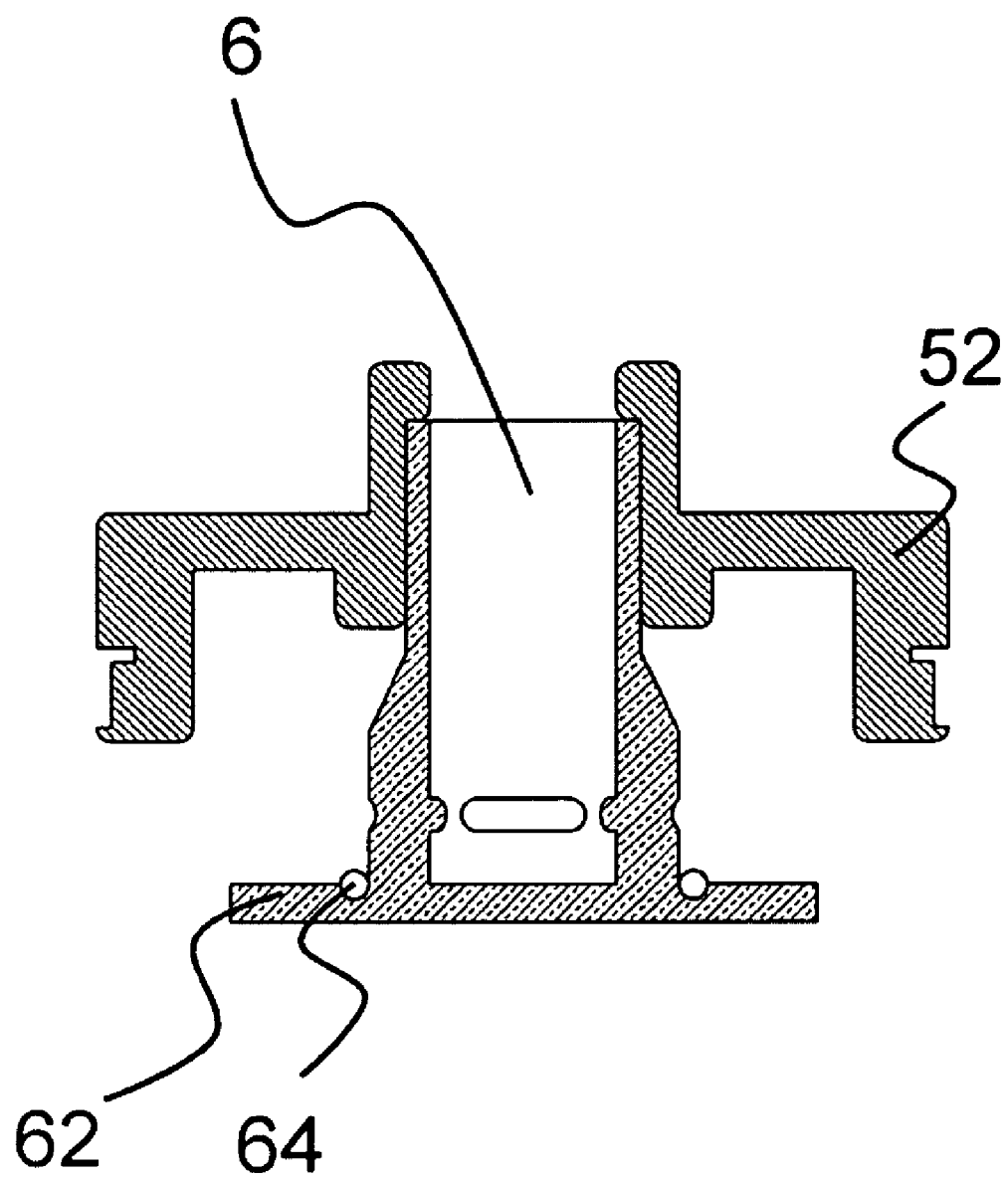
FIG. 6 shows a view of a switch device according to present invention.

Then, referring to FIG. 6, the enlarged portion 62 of the switch device 6 also includes a second elastic element 64 to maintain the airtight between the switch device 6 and the first base 51.

Figure 7A:
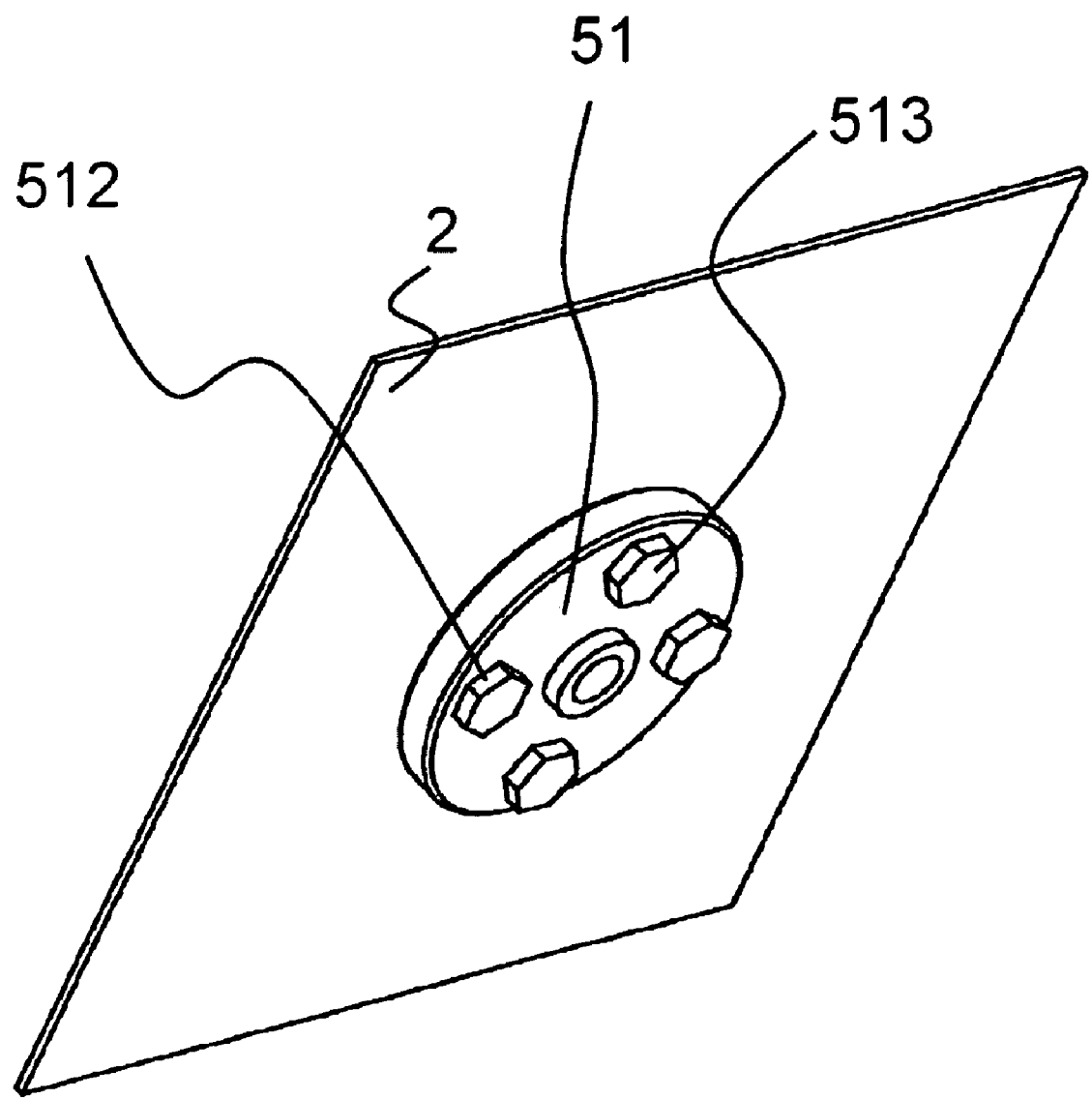
FIGS. 7A and 7B show a view of the first base according to present invention; and FIG. 8A through FIG. 8C shows the connecting between the first base and the supply device according to present invention.
Figure 7B:
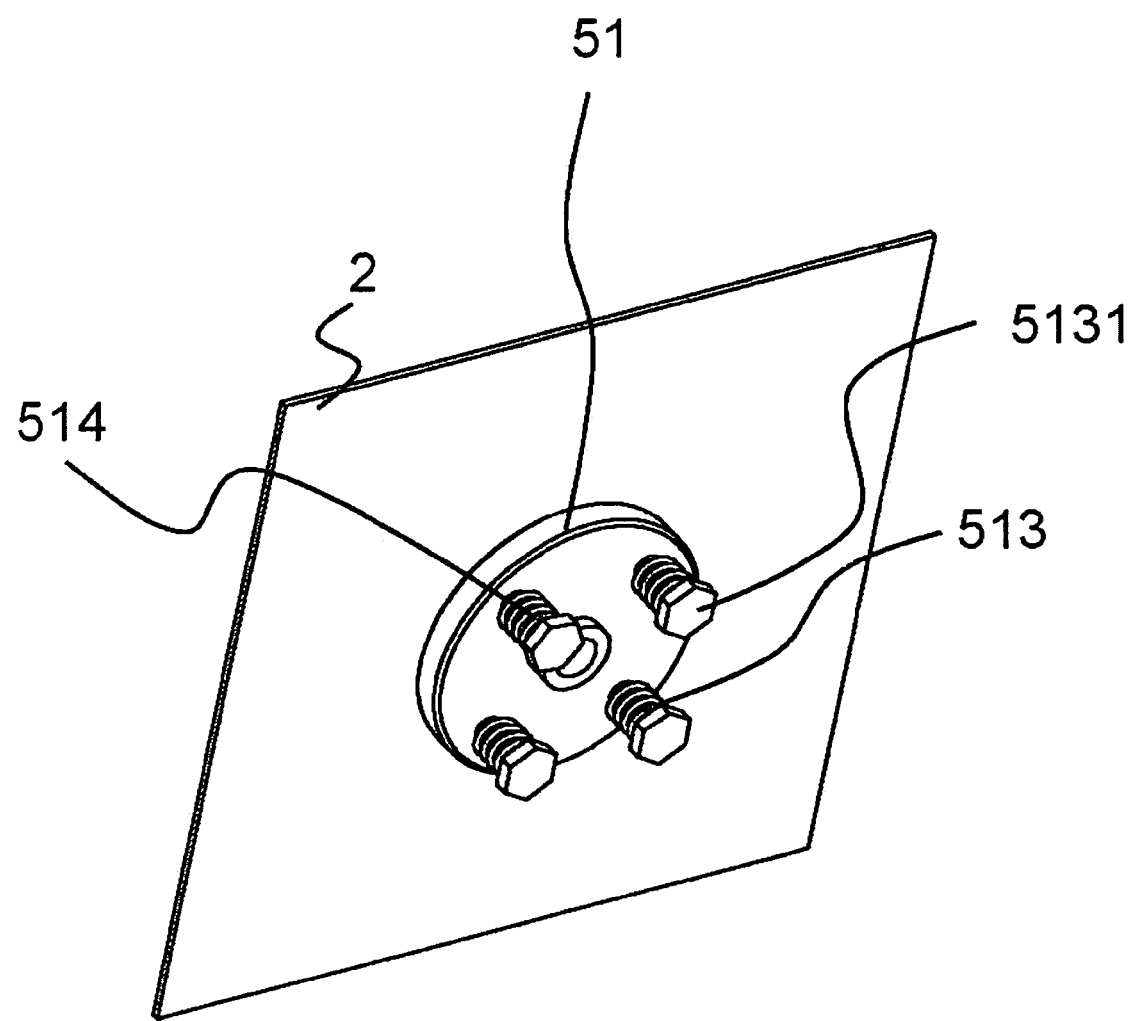

Referring to FIG. 7, the first base 51 also includes at least one fastening position 512, and at least one fastening element 513 is connected the supporting base 2. Furthermore, the fastening element 513 includes a fastening head 5131 as shown in FIG. 7B. In addition, the second inlet port 5 also includes a second elastic element 514, which is disposed in the middle of the first base 51 and the fastening head 5131 of the fastening element 513, and is provided for adjusting the corresponding position between the second inlet port 5 and the supporting base 2. When the supporting base 2 or the storage apparatus 4 is incline or misalignment, the second inlet port 5 can be adjust to prevent the leakage of the gas.

Figure 8A:
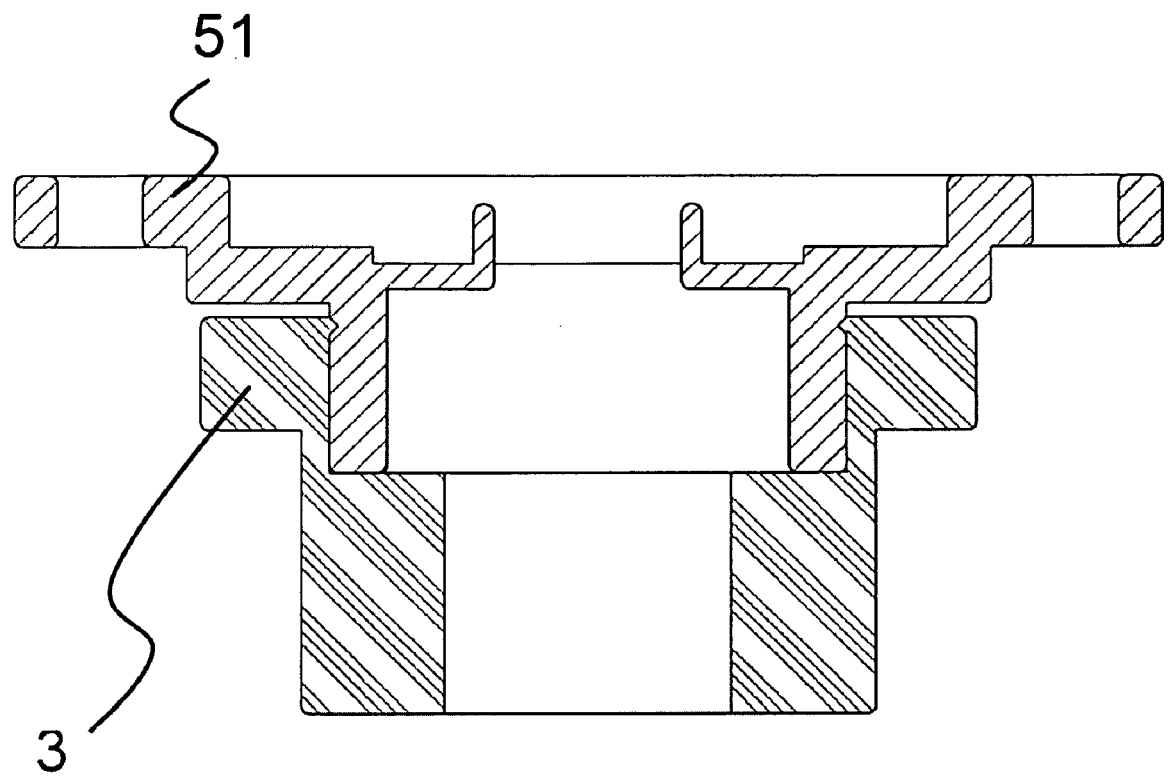
Figure 8B:
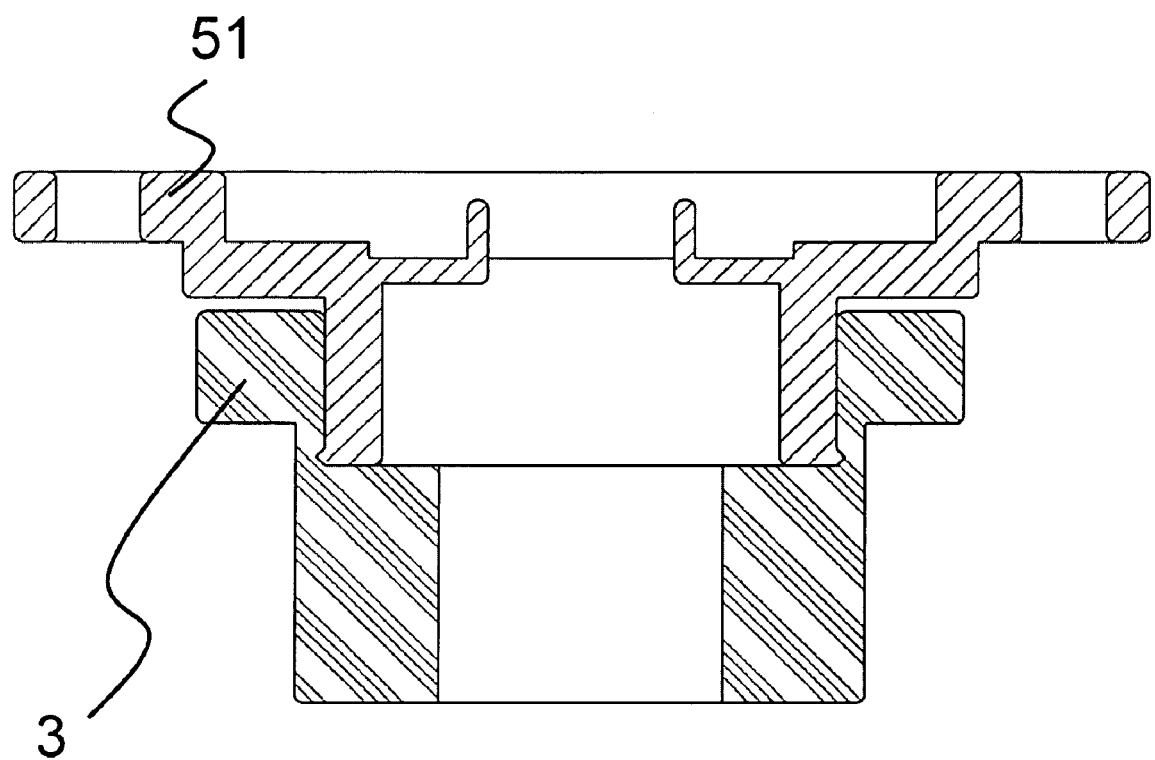
Figure 8C:
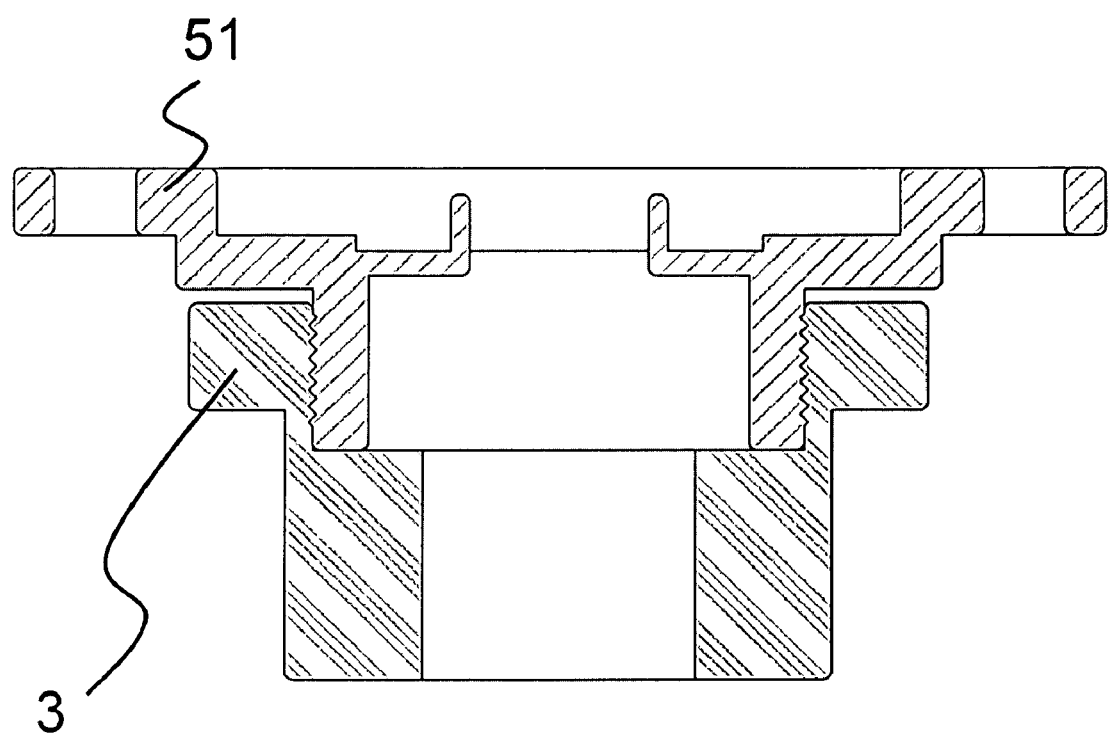

Referring to FIG. 8A to FIG. 8C, the first base 51 is connected the supply device 3 by the way of the wedge (as shown in FIG. 8A and FIG. 8B) or spiral (as shown in FIG. 8C).

Although specific embodiments have been illustrated and described, it will be obvious to those skilled in the art that various modifications may be made without departing from what is intended to be limited solely by the appended claims.

What is claimed is:

1. A gas filling apparatus, connected with an air feed source for introducing a gas into a storage apparatus that is used for storing a semiconductor element or a reticle, said storage apparatus having at least one first inlet port, and said gas filling apparatus comprises:

at least one supporting base is provided for holding said storage apparatus; and at least a second inlet port is disposed on said supporting base corresponding said first inlet port of said storage apparatus, said storage apparatus comprises:

a first base having a first through hole therein;

a second base is disposed on said first base and having a second through hole therein and corresponding said first through hole of said first base;

a first elastic element is disposed on said second base corresponding a contact portion of said first inlet port of said storage apparatus;

a fixing element is disposed on said second base and is used to fix said first elastic element on said second base;

a switch device is disposed on both of said first through hole of said first base and said second through hole of said second base, said switch device comprises:

a hollow tube having a first end that is fixed on said second base, and an enlarged portion of second end is engaged with said first base to close said first through hole of said first base, at least one gap is disposed on said enlarged portion adjacent to said hollow tube; and a retractable element is disposed around the outside of said hollow tube to supply said gas that flows into said hollow tube, wherein when said storage apparatus is disposed on said supporting base, said first inlet port of said storage apparatus is contacted with said second inlet port so that said second base is moved downward to drive said switch device moved downward to separate said enlarged portion from said first base to expose said gap of said hollow tube by the weight of said storage apparatus, thereby, said gas flows into said switch device and filled into said storage apparatus;

when said storage apparatus is separated from said supporting base, said second base is raised up by said retractable element to drive said enlarged portion of said hollow tube to restore to the closed position of said first through hole of said first base.

2. The gas filling apparatus according to claim 1, wherein said contact portion between said first elastic element and said first inlet port is a plane surface or a cambered surface.

3. The gas filling apparatus according to claim 1, wherein said fixing element fixed said second base by way of wedge or spiral.

4. The gas filling apparatus according to claim 1, wherein said hollow tube of said switch device fixed said second base by way of wedge or spiral.

5. The gas filling apparatus according to claim 1, wherein said enlarged portion of said switch device has a second elastic element to maintain airtightness between said switch device and said first base.

6. The gas filling apparatus according to claim 1, wherein said first base has at least one fastening position which is fixed with said supporting base by at least one fastening element.

7. The gas filling apparatus according to claim 1, wherein said first base is connected with said supply device.

8. The gas filling apparatus according to claim 7, wherein the connection between said first base and said supply device by way of wedge or spiral.

9. An inlet port, disposed on a supporting base of a gas filling apparatus, said gas filling apparatus used for introducing a gas into a storage apparatus and is used for storing a semiconductor element or a reticle, said storage apparatus having at least one first inlet port, and said inlet port comprises:

a first base having a first through hole therein;

a second base is disposed on said first base and having a second through hole corresponding said first through hole of said first base;

a first elastic element is disposed on said second base and corresponding a contact portion of said first inlet port of said storage apparatus;

a fixing element is disposed on said second base and used to fix said first elastic element on said second base;

a switch device is disposed on said first through hole of said first base and said second through hole of said second base for controlling input or output of said gas that is introduced into said second inlet port, said switch device comprising:

a hollow tube having a first end that is fixed to said second base and a second end with an enlarged portion that is engaged said first base to said first through hole of said first base, and a portion adjacent to said enlarged portion having at least one gap that is used for introducing said gas into said hollow tube;

a retractable element is disposed around outside of said hollow tube and engaged in the middle of said second base and said first base;

wherein when said storage apparatus is disposed on said supporting base, said first inlet port of said storage apparatus is contacted said second inlet port, so that said second base is moved downward to drive said switch device moved downward to separate said enlarged portion from said first base to expose said gap of said hollow tube by the weight of said storage apparatus, thereby, said gas flows into said switch device and filled into said storage apparatus;

when said storage apparatus is separated from said supporting base, said second base rises up by said retractable element to restore said enlarged portion of said hollow tube to the closed position of said first through hole of said first base.

10. The inlet port according to claim 9, wherein said contact portion between said first elastic element and said first inlet port is a plane surface or a cambered surface.

11. The inlet port according to claim 9, wherein said fixing element fixed said second base by way of wedge or spiral.

12. The inlet port according to claim 9, wherein said hollow tube of said switch device fixed said second base by way of wedge or spiral.

13. The inlet port according to claim 9, wherein said enlarged portion of said switch device has a second elastic element to maintain the airtight between said switch device and said first base.

14. The inlet port according to claim 9, wherein said first base has at least one fastening position which is fixed with said supporting base by at least one fastening element.

15. The inlet port according to claim 9, wherein said first base is connected with said supply device.

16. The inlet port according to claim 15, wherein the connection between said first base and said supply device by way of wedge or spiral.

* * * * *